(12) United States Patent
Chang et al.

(10) Patent No.: US 7,842,157 B2
(45) Date of Patent: Nov. 30, 2010

(54) METHOD FOR BONDING PLASTIC MICRO CHIP

(75) Inventors: Jun Keun Chang, Seoul (KR); Dae Sung Hur, Kyungsan-Si (KR); Chanil Chung, Uniwang-Si (KR); Jun Ha Park, Suwon-Si (KR); Han Sang Jo, Anyang-Si (KR)

(73) Assignee: Digital Bio Technology, Kwanak, Seoul (KR)

( * ) Notice: Subject to any disclaimer, the term of this patent is extended or adjusted under 35 U.S.C. 154(b) by 601 days.

(21) Appl. No.: 10/583,149

(22) PCT Filed: Dec. 17, 2004

(86) PCT No.: PCT/KR2004/003337

§ 371 (c)(1),
(2), (4) Date: Jun. 16, 2006

(87) PCT Pub. No.: WO2005/059549

PCT Pub. Date: Jun. 30, 2005

(65) Prior Publication Data

US 2007/0141805 A1    Jun. 21, 2007

(30) Foreign Application Priority Data

Dec. 18, 2003    (KR) ................ 10-2003-0093443

(51) Int. Cl.
  *B29C 65/00* (2006.01)
(52) U.S. Cl. ............... 156/292; 156/305; 156/308.4; 156/308.6; 156/257; 156/272.6
(58) Field of Classification Search ........ 438/455, 438/456, 690, 127, 670; 356/246; 156/292, 156/305, 308.4, 308.6, 257, 272.6
See application file for complete search history.

(56) References Cited

U.S. PATENT DOCUMENTS

| | | | | |
|---|---|---|---|---|
| 4,357,369 A | * | 11/1982 | Kilichowski et al. | .......... 216/18 |
| 4,485,171 A | * | 11/1984 | Ikeda et al. | .............. 435/30 |
| 6,284,113 B1 | | 9/2001 | Bjornson et al. | |
| 6,329,224 B1 | * | 12/2001 | Nguyen et al. | ............. 438/127 |
| 6,375,871 B1 | | 4/2002 | Bentsen et al. | |
| 6,425,972 B1 | * | 7/2002 | McReynolds | ............. 156/285 |
| 6,559,940 B2 | * | 5/2003 | Fujiyama | ............... 356/246 |
| 6,561,208 B1 | | 5/2003 | O'Connor et al. | |
| 2002/0117517 A1 | | 8/2002 | Unger et al. | |
| 2002/0177319 A1 | * | 11/2002 | Chou | ..................... 438/690 |

OTHER PUBLICATIONS

Abdelghani-A. et al, Surface Plasmon Resonance Fibre-Optic Sensor For Gas Detection, 3rd European Conference on Optical Chemical Sensors and Biosensors, Zurich, Switzerland, Mar. 31-Apr. 3, 1996, Abstract.*

* cited by examiner

*Primary Examiner*—Kenneth Molles
*Assistant Examiner*—Fang-Xing Jiang
(74) *Attorney, Agent, or Firm*—Browdy and Neimark, PLLC

(57) ABSTRACT

Disclosed is a method of bonding upper and lower substrates for manufacturing a plastic micro chip comprising the upper substrate, the lower substrate and a sample filling space having a predetermined height for filling a sample between the upper and lower substrates. According to the method, the upper and lower substrates are bonded by introducing an organic solvent between the upper and lower substrates. In addition, the invention provides a method of manufacturing a micro chip using the method and a micro chip manufactured according to the method. According to the invention, it is possible to easily and precisely bond the upper and lower substrates of the plastic micro chip.

13 Claims, 5 Drawing Sheets

METHOD FOR BONDING PLASTIC MICRO CHIP

TECHNICAL FIELD

The invention relates to a method of bonding a plastic micro chip, and more particularly to a method of bonding upper and lower substrates for manufacturing a plastic micro chip comprising the upper substrate, the lower substrate and a sample filling space having a predetermined height for filling a sample between the upper and lower substrates, wherein the upper and lower substrates are bonded by introducing an organic solvent between the upper and lower substrates. In addition, the invention relates to a method of manufacturing a micro chip using the boning method and a micro chip manufactured according to the method.

BACKGROUND ART

Currently, researches and commercialization of a point of care (POC) and a lab-on-a-chip (LOC) (which means a laboratory on a chip and is a technology for diagnosing various diseases in a small chip at a time) are actively carried out in a bio-industry. Typically, products allowing for a rapid diagnosis and experiment as the POC or LOC are released as a product with a special surface treatment or reagent fixed in a plastic micro chip or cartridge. It can be said that the cartridge or chip is a core of the product.

Generally, the plastic micro chip or cartridge used for the POC and LOC is made of polyethylene (PE) derivatives such as polycarbonate (PC), polystyrene (PS), polypropylene (PP) and polyethyleneterephthalate (PET), polymethylmethacrylate (PMAA) or an acryl based plastic, and is used as a disposable.

FIGS. 1 and 2 show a typical plastic micro chip used for a lab-on-a-chip. Generally, the plastic micro chip comprises an upper substrate 16, a lower substrate 18 and a sample filling space (channel) 10 having a predetermined height D or a fine structure, etc. between the upper and lower substrates.

It is required that the channel should be precisely manufactured to have a height of several μm to several hundreds μm when manufacturing the plastic micro chip. Accordingly, it is required to very precisely and correctly bond the upper and lower substrates including the channel or fine structure so that the plastic micro chip can perfectly function. In addition, surface properties of main parts of the cartridge or the chip should be maintained as they are.

When manufacturing the plastic micro chip, the upper and lower substrates are generally bonded by a heat bonding, an ultrasonic bonding, an optical method or an adhesive using a primer.

The heat bonding method is mainly used to bond the material such as a film. The optical method is a boding method using a specific molecular structure of the plastic surface and can be applied to some plastics only. The method using the adhesive is used even in daily life. The ultrasonic bonding method is actively used in industries.

However, there are some disadvantages when bonding the plastic micro chip using the above methods. In other words, there is a limitation in correctly and precisely bonding the chip having the fine channel or structure without an error, and it is difficult to bond the chip without influencing on properties of an inner surface thereof.

FIGS. 3 and 4 show a bonding process according to an ultrasonic bonding method of the prior art.

As shown in FIG. 3, a protrusion is formed on a lower surface of an upper substrate 16 and a recess is formed in an upper surface of a lower substrate 18. Then, when an ultrasonic wave is applied with the upper and lower substrates 16, 18 being overlapped, the protrusion of the upper substrate 16 is melted and thus the upper substrate 16 is bonded to the lower substrate 18. However, as shown in FIG. 4, since the bonding surface is irregular and rough, an empty space can be formed and it is difficult to control the channel to have a predetermined height (D), so that an error can occur.

Generally, in a plastic micro chip, the height of the channel should be also precisely controlled in order to precisely manufacture a volume of the channel. However, it is difficult to precisely control the height of the channel with the prior bonding methods.

In addition, since the channel is not completely sealed and an empty space can be thus formed, a sample in the channel can flow out to the exterior and an air bubble can occur in the sample inside of the channel.

DISCLOSURE OF INVENTION

Accordingly, the present invention has been made to solve the above-mentioned problems occurring in the prior art. In the present invention, an organic solvent is introduced between an upper substrate and a lower substrate, and thus the substrates are easily and precisely bonded without an error when they are bonded.

The object of the invention is to provide a method of bonding the upper and lower substrates in order to manufacture a plastic micro chip used for a lap-on-a-chip (LOC), etc.

It is another object to provide a method of manufacturing a plastic micro chip using the bonding method.

It is yet another object to provide a plastic micro chip manufactured by the bonding method.

The invention relates to a method of bonding an upper substrate and a lower substrate in order to manufacture a plastic micro chip.

More specifically, the invention relates to a method of bonding an upper substrate and a lower substrate in order to manufacture a plastic micro chip comprising the upper substrate, the lower substrate and a sample filling space having a predetermined height for filling a sample between the upper and lower substrates, wherein the upper and lower substrates are bonded by introducing an organic solvent between the upper and lower substrates.

In addition, the invention provides a method of manufacturing a plastic micro chip comprising an upper substrate, a lower substrate and a sample filling space having a predetermined height for filling a sample between the upper and lower substrates, comprising steps of:

(a) forming a fine channel space for filling a bonding organic solvent in a bonding region of a circumference of the sample filling space; and (b) overlapping the upper and lower substrates each other, and then introducing the organic solvent into the fine channel to bond the upper and lower substrates.

Preferably, one or more holes for introducing the organic solvent communicating with the fine channel may be formed when the fine channel is formed in the step of (a).

After forming the fine channel, it may preferably to perform a corona or plasma treatment for the bonding area so that the organic solvent subsequently introduced smoothly flows and a bonding strength is increased. The plastic micro chip having a functional channel has a hydrophilic surface or a functional group such as amine group, carboxyl group or aldehyde capable of combining with a protein (for example, antigen, antibody or enzyme) or DNA. When the plasma treatment is performed as described above, impurities are removed from the surface of the bonding region and a surface energy is increased, so that the solvent can flow well. In addition, the bonding strength can be increased. However, this treatment does not have influence on the surface of the chip.

When forming the fine channel, the channel can become opaque if a height of the channel is excessively high. Accordingly, it is preferred to form the fine channel so that the height thereof is not too high. For example, it is preferred to form the channel to have a height of about 100 µm or less.

In addition, according to the invention, there is provided a plastic micro chip comprising an upper substrate, a lower substrate, a sample filling space having a predetermined height for filling a sample between the upper and lower substrates, and a fine channel defining a space for filling an organic solvent so as to bond the upper and lower substrates in a bonding region of a circumference of the sample filling space of the upper substrate.

Preferably, the plastic micro chip may comprise one or more holes for introducing the organic solvent communicating with the fine channel. The solvent in the fine channel can smoothly flow by pressurizing or decompressing the fine channel through the introducing hole.

According to the invention, the upper and lower substrates are made of polyethylene derivatives such as polycarbonate, polystyrene, polypropylene and polyethyleneterephthalate, polymethylmethacrylate or an acryl based plastic materials.

Any organic solvent capable of dissolving the material of the substrates may be used in the invention. For example, ketone, aromatic hydrocarbon, halogenated hydrocarbon or cyanoacrylate compound or a mixture thereof is used. Especially, acetone, chloroform, methylene chloride, ethylcyanoacrylate or carbon tetrachloride or a mixture thereof is preferably used.

BRIEF DESCRIPTION OF DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF REFERENCE NUMERALS FOR IMPORTANT PART OF THE DRAWINGS

100: plastic micro chip

120: upper substrate 140 lower substrate

10: sample filling space

12: sample introducing hole

14: sample discharging hole

20: bonding region

30: fine channel

35: organic solvent introducing hole

D: height of sample filling space

BEST MODE FOR CARRYING OUT THE INVENTION

Hereinafter, preferred embodiments of the present invention will be described with reference to the accompanying drawings. In the following description of the present invention, a detailed description of known functions and configurations incorporated herein will be omitted when it may make the subject matter of the present invention rather unclear.

Figure 1:
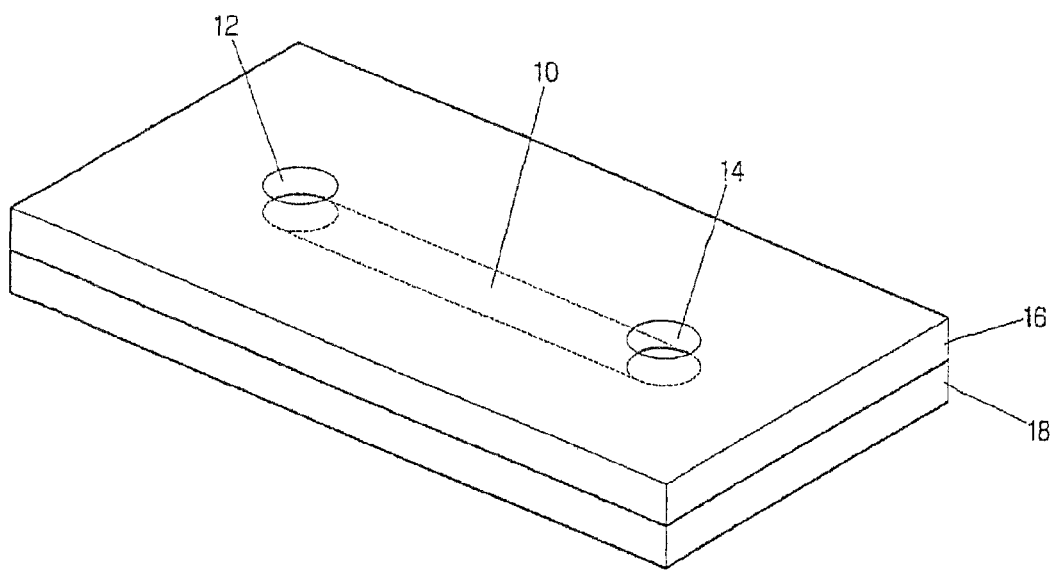
FIGS. 1 and 2 are a perspective view and a cross sectional view of a conventional plastic micro chip.
Figure 2:
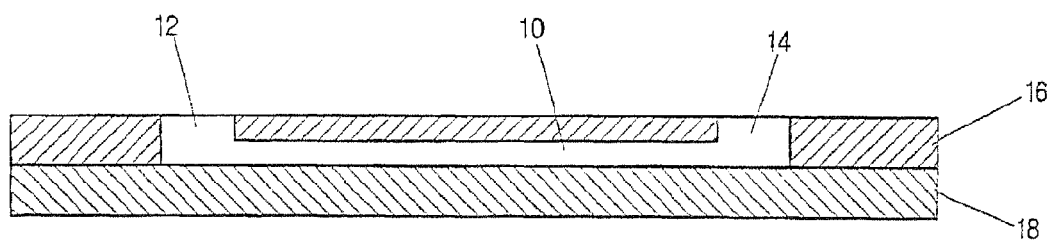
Figure 3:
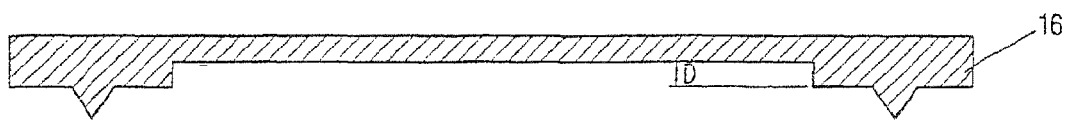
FIGS. 3 and 4 show a method of bonding an upper substrate and a lower substrate of a plastic micro chip according to the prior art.
Figure 3:
Figure 4:
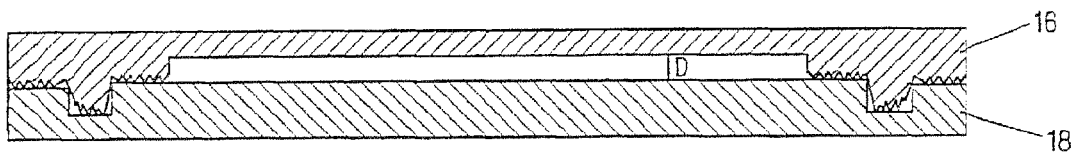
Figure 5:
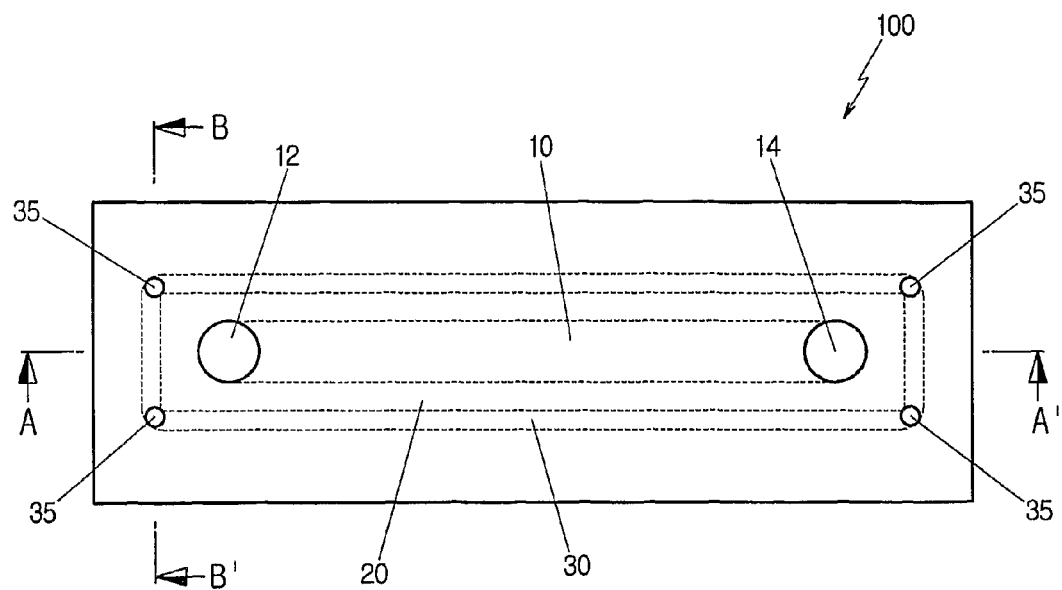
FIG. 5 is a plan view of a plastic micro chip according to a first embodiment of the invention.
Figure 6:
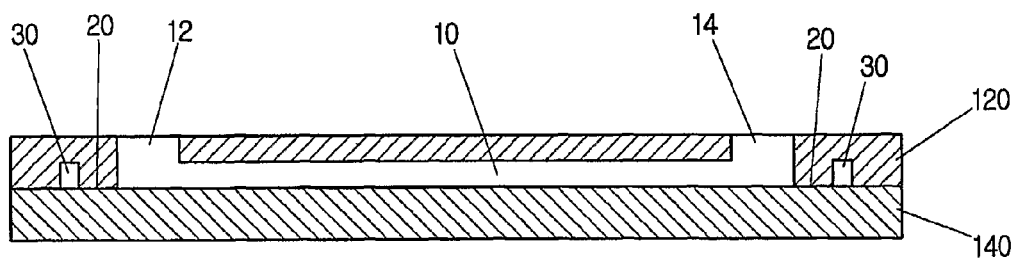
FIG. 6 is a cross sectional view of the plastic micro chip in FIG. 5 taken along line A-A'.
Figure 7:
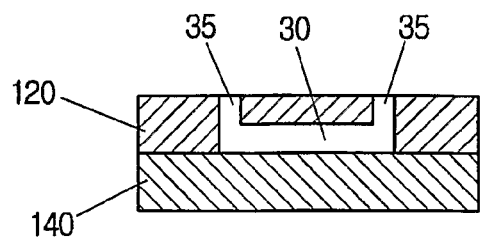
FIG. 7 is a cross sectional view of the plastic micro chip in FIG. 5 taken along line B-B'.

FIG. 5 is a plan view of a plastic micro chip 100 for bonding according to an embodiment of the invention. FIG. 6 is a cross sectional view of the plastic micro chip in FIG. 5 taken along line A-A'. FIG. 7 is a cross sectional view of the plastic micro chip in FIG. 5 taken along line B-B'.

The plastic micro chip 100 comprises an upper substrate 120, a lower substrate 140 and a sample filling space 10 having a predetermined height (D) for filling a sample between the upper substrate 120 and the lower substrate 140. A sample introducing hole 12 is formed at a side of the sample filling space 10 and a sample discharging hole 14 is formed at the other side.

A fine channel space 30 having a height of 100 µm for filling a bonding organic solvent is formed in a bonding region 20 of a circumference of the sample filling space 10. In addition, organic solvent introducing holes 35 communicating with the fine channel are formed at each of the apexes so that the organic solvent can be introduced into the fine channel 30.

Surfaces of the upper substrate 120 and the lower substrate 140 are plasma-treated so that an organic solvent (for example, acetone) subsequently introduced can flow well.

After that, in order to bond the upper substrate 120 and the lower substrate 140, the lower substrate 140 and the upper substrate 120 formed with the fine channel space 30 are overlapped each other, and the acetone is introduced into the organic solvent introducing holes 35 of the fine channel 30 in a small amount (few µl). The acetone flows along the fine channel 30 by the capillary phenomenon, and melts the upper substrate 120 and the lower substrate 140 in the bonding region 20 of the periphery of the fine channel 30, thereby bonding them.

The acetone remaining in the fine channel 30 is rapidly evaporated into the air, and the bonding region 20 is firmly bonded while sealing the sample filling space 10 without a bonding tolerance.

Figure 8:
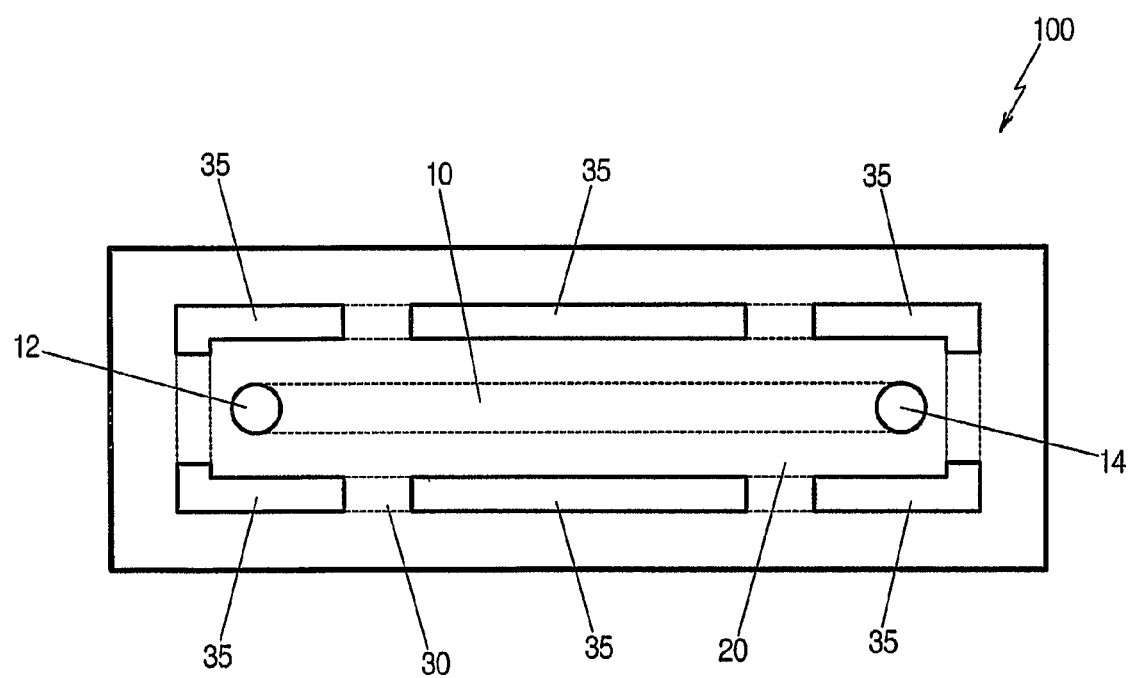
FIG. 8 is a plan view of a plastic micro chip according to a second embodiment of the invention.

FIG. 8 shows a plastic micro chip having an enlarged organic solvent introducing holes 35 for easily introducing the organic solvent into the fine channel space 30.

Figure 9:
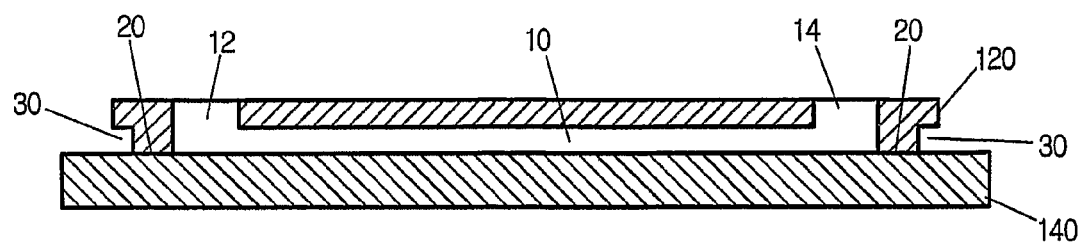
FIG. 9 is a cross sectional view of a plastic micro chip according to a third embodiment of the invention.

FIG. 9 is a cross sectional view of a plastic micro chip according to a third embodiment of the invention. The plastic micro chip according to the third embodiment of the invention includes recesses 30 formed in each of side lower ends of the upper substrate 120. The upper substrate 120 and the lower substrate 140 of the bonding region 20 can be bonded each other by introducing the organic solvent into the recesses.

INDUSTRIAL APPLICABILITY

As described above, when the plastic micro chip is manufactured according to the method of the invention, it is possible to precisely and correctly bond the upper and lower substrates of the plastic micro chip. Particularly, it is possible to perfectly seal the sample filling space (channel) of the plastic micro chip and to correctly manufacture the channel having a desired height.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method of bonding an upper substrate and a lower substrate in order to manufacture a plastic micro chip comprising the upper substrate, the lower substrate and a sample filling space having a predetermined height for filling a sample between the upper and lower substrates, the method comprising:
   (a) forming recesses in each of side lower ends of a bonding region of the upper substrate, wherein the bonding region is a circumference region of the sample filling space; and
   (b) overlapping the upper substrate and the lower substrate each other, and then introducing the organic solvent into the recesses to bond the upper and lower substrates, wherein the recesses are open channels and the organic solvent is introduced into the recesses by capillary phenomenon,
   wherein the bonding region is bonded by the organic solvent introduced into the recesses.

2. The method according to claim 1, wherein the organic solvent is at least one selected. from a group consisting of ketone, aromatic hydrocarbon, cyanoacrylate compound and halogenated hydrocarbon.

3. The method according to claim 2, wherein the organic solvent is at least one selected from a group consisting of acetone, chloroform, methylene chloride, ethlcyanoacrylate and carbon tetrachloride.

4. The method according to claim 1, wherein the upper and lower substrates are made of polycarbonate, polystyrene, polyproplene, polyethylene derivatives or polymethylmethylmethacrylate.

5. A method of manufacturing a plastic micro chip comprising an upper substrate, a lower substrate and a sample filling space having a predetermined height for filling a sample between the upper and lower substrates, the method comprising:
   (a) forming recesses in each of side lower ends of a bonding region of the upper substrate, wherein the bonding region is a circumference region of the sample filling space; and
   (b) overlapping the upper substrate and the lower substrate each other, and then introducing the organic solvent into the recesses to bond the upper and lower substrates, wherein the recesses are open channels and the organic solvent is introduced into the recesses by capillary phenomenon,
   wherein the bonding region is bonded by the organic solvent introduced into the recesses.

6. The method according to claim 5, further comprising a step of forming one or more holes for introducing the organic solvent communicating with the fine channel when the fine channel is formed in the step of (a).

7. The method according to claim 5, further comprising a step of performing a corona or plasma treatment for the bonding area so that the organic solvent subsequently introduced smoothly flows and a bonding strength is increased, after forming the fine channel.

8. The method according to claim 5, wherein the fine channel has height of 100μm or less.

9. The method according to claim 5, wherein the step of (b) further comprises a sub-step of pressurizing or decompressing the fine channel after introducing the organic solvent into fine channel.

10. The method according to claim 8, wherein the organic solvent is at least one selected from a group consisting of ketone, aromatic hydrocarbon, cyanoacrylate compound and halogenated hydrocarbon.

11. The method according to claim 10, wherein the organic solvent is at least from a group consisting of acetone, chloroform, methylene chloride, ethylcyanoacrylate and carbon tetrachloride.

12. The method according to claim 5, wherein the upper and lower substrates are made of polycarbonate, polystyrene, polypropylene, polyethylene derivatives or polymethlmethacrylate.

13. A method for making a plastic micro chip comprising:
   (a) providing an upper substrate and a lower substrate, the lower substrate and the upper substrate being adapted to be joined together along an interface in such a way as to define therebetween a sample filling space having a predetermined height, the sample filling space being entirely surrounded by solid plastic;
   further adapted to provide a fine channel within the solid plastic surrounding the sample filling space, the fine channel being provided in each of side lower ends of a bonding region of the upper substrate;
   further adapted to provide solvent delivery holes whereby solvent can be delivered to the fine channel;
   (b) bringing the upper substrate and lower substrate together into a laminating position;
   (c) introducing organic solvent into the fine channel to join the upper substrate with the lower substrate, with the organic solvent passing through the fine channel and effecting bonding by movement of the organic solvent by capillary action.

* * * * *